United States Patent
Hisamune

(10) Patent No.: US 6,414,352 B2
(45) Date of Patent: *Jul. 2, 2002

(54) SEMICONDUCTOR DEVICE HAVING AN ELECTRONICALLY INSULATING LAYER INCLUDING A NITRIDE LAYER

(75) Inventor: Yosiaki Hisamune, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/150,936

(22) Filed: Sep. 10, 1998

(30) Foreign Application Priority Data

Sep. 11, 1997 (JP) .............................. 9-246968

(51) Int. Cl.[7] .............................. H01L 29/788
(52) U.S. Cl. ................. 257/320; 257/315; 257/316
(58) Field of Search ................. 257/315, 316, 257/637, 638, 640, 641, 649, 344, 317, 319, 320, 324, 325, 644, 368, 369, 510, 513, 499; 438/261, 297

(56) References Cited

U.S. PATENT DOCUMENTS

| | | | | |
|---|---|---|---|---|
| 3,649,886 A | * | 3/1972 | Kooi | 257/638 |
| 4,868,138 A | | 9/1989 | Chan et al. | 438/297 |
| 5,296,734 A | * | 3/1994 | Satoh | 257/638 |
| 5,343,063 A | | 8/1994 | Yuan et al. | 257/317 |
| 5,498,560 A | | 3/1996 | Sharma et al. | 438/261 |
| 5,595,924 A | | 1/1997 | Yuan et al. | 437/43 |
| 5,637,897 A | * | 6/1997 | Oyama | 257/320 |
| 5,827,747 A | * | 10/1998 | Wang et al. | 257/344 |
| 5,986,303 A | * | 11/1999 | Choi et al. | 257/320 |

FOREIGN PATENT DOCUMENTS

| | | | | |
|---|---|---|---|---|
| JP | 57-196543 | 12/1982 | | 257/499 |
| JP | 2-10741 | 1/1990 | | 257/369 |
| JP | 2-58252 | 2/1990 | | 257/644 |
| JP | 2-291166 | 11/1990 | | 257/369 |
| JP | 4-25129 | 1/1992 | | 257/499 |
| JP | 4-101463 | * 4/1992 | | 257/324 |
| JP | 4-177724 | 6/1992 | | 257/368 |
| JP | 4-340767 | 11/1992 | | 257/316 |
| JP | 5-259450 | 10/1993 | | 257/368 |
| JP | A 8204038 | 8/1996 | | 257/315 |
| JP | 8-274166 | 10/1996 | | 257/513 |
| JP | 9-134954 | 5/1997 | | 257/510 |
| JP | 9-246500 | 9/1997 | | 257/315 |

OTHER PUBLICATIONS

Japanese Patent Publication No. 8–220028, (corresponds to U.S. Patent Application 08/914,169 filed Aug. 19, 1997.
Japanese Office Action dated Feb. 6, 2001.

* cited by examiner

*Primary Examiner*—Steven Loke
(74) *Attorney, Agent, or Firm*—Sughrue Mion, PLLC

(57) ABSTRACT

A semiconductor device such as a flash EEPROM has oxide/nitride/oxide sandwich structure deposited on a semiconductor substrate. Optical lithography and plasma-assisted etching are used to remove portions of the structure that extend over active regions. Since the nitride layer of the etched sandwich structure has oxidation proof, oxygen radical is prevented from reaching the substrate. Thus, the bird's beak is prevented from appearing.

2 Claims, 8 Drawing Sheets

US 6,414,352 B2

1

SEMICONDUCTOR DEVICE HAVING AN ELECTRONICALLY INSULATING LAYER INCLUDING A NITRIDE LAYER

FIELD OF THE INVENTION

The present invention relates to semiconductor devices, such as flash electrically erasable and programmable read only memory (EEPROM) cell structures, and processes for making them, and more particularly to a bird's beak free isolation technology for memory cell structures.

BACKGROUND OF THE INVENTION

In the development of non-volatile semiconductor memory devices of the types such as erasable (EPROM), electrically erasable (EEPROM), and flash EEPROM devices, it is currently a goal to provide an array of a great number of individual memory cells on a single silicon integrated circuit chip of practical size. This trend requires failure free isolation technology to physically and electrically separate neighboring memory elements (memory cells) and peripheral control circuit elements. Currently, an electrically insulating layer is employed for this purpose.

A silicon substrate area occupied by active elements (memory elements and peripheral circuit elements) may be called an "active element region," and a silicon substrate area occupied by an electrically insulating layer a "neighboring elements separating region or separating region." An electrically insulating layer that is grown on the separating region may be called a "neighboring elements separating insulating layer." Currently, the insulating layer is grown over each of the separating regions on the semiconductor (silicon) substrate by LOCOS (local oxidation) technique. Specifically, an oxide layer, with a thickness of around 50 nanometers (nm) of silicon dioxide and a silicon nitride layer with a thickness of around 100 to 400 nanometers (nm) are grown onto the substrate to form a sandwich structure. Optical lithography and dry etching techniques remove portions of the silicon nitride layer extending over the separating regions. After removing the portions of the silicon nitride layer, thermal oxidation grows an oxide layer that forms the separating insulating layer.

The LOCOS technique involves a bird's beak problem, which limits the scaling down of the cell array structure.

U.S. Pat. No. 5,595,924 (issued on Jan. 21, 1997 to Yuan et al.) teaches a technique of forming a cell array structure with the size of individual cells being reduced, thereby increasing the number of cells which may be formed on a semiconductor substrate of a practical size. The technique employs three processing steps. The first step is to deposit a silicon dioxide layer on a silicon substrate by CVD. The second or next step is to etch away portions of silicon dioxide layer over active regions by optical lithography and dry etching techniques. The third step is to form spacers of silicon dioxide along the sidewall of each opening in the etched silicon dioxide layer.

FIGS. 5A through 5E illustrate processing steps employed by the known technique disclosed by the above-mentioned patent. In FIG. 5A, an oxide layer 501 of silicon dioxide is deposited on a silicon substrate 500 by CVD. In FIG. 5B, optical lithography technique forms a resist 502 over each of separating region. In FIG. 5C, dry etching technique etches away, using the resists 502 as a mask, portions of oxide layer that extend over active element regions. Subsequently, the resists 502 are removed. As shown in FIG. 5C, the edges of the etched oxide layer 501 have essentially vertical profiles. In FIG. 5D, low-pressure CVD deposits an oxide layer 503

2 over the entire surface of the etched oxide layer 501 and the exposed areas of the silicon substrate. In FIG. 5E, anisotropic dry etching technique remove all of the oxide layer 503 leaving portions on the edges of the etched oxide layer 501 as spacers 504 along the sidewall of each opening in the etched oxide layer 501.

Processing steps as illustrated in FIGS. 5D and 5E may be replaced by a single processing step of anisotropic etching the oxide layer 501 so that the edges of the etched oxide layer 501 have slightly tapered profile as shown in FIG. 6C at 601. FIGS. 6A and 6B correspond to FIGS. 5A and 5B, respectively.

U.S. Pat. No. 5,343,063 (issued on Aug. 30, 1994 to Yuan et al.), which appears to correspond to JP-A 4-340767 published on Nov. 27, 1992, discloses a memory array of PROM, EPROM or EEPROM cells. Each cell is formed in a trench of a thick oxide layer that is deposited on a silicon substrate, in a manner that a significant portion of opposing areas of the floating gate and control gate of each cell, which provide capacitive coupling between them, are formed vertically. This allows the density of the array to be increased. This is because the amount of semiconductor substrate area occupied by each cell is decreased without having to sacrifice the amount or quality of forming capacitive coupling.

FIGS. 7 and 8 are a plan view and a sectional view taken along the line 8—8 of the plan view illustrating a flash EEPROM device to which the present invention has been applied.

Each memory cell has an embedded diffusion layer ($BN^+$) as a bit line, and employs a laminated structure of the floating gate, control gate and erase gate. In FIGS. 7 and 8, the reference numeral 700 designates a silicon substrate of the P-type, and the reference numeral 701 designates an oxide layer of silicon dioxide, which forms separating regions. The reference numeral 702 designates active regions. The reference numeral 703 designates auxiliary bit lines. The reference numeral 704 designates floating gates. The reference numeral 705 designates control gates serving as word lines. The reference numeral 706 designates erase gates. The reference numeral 707 designates a first gate-insulating layer formed on the silicon substrate 700. The reference numeral 708 designates a second gate-insulating layer between the adjacent floating and control gates 704 and 705. The reference numeral 709 designates a third gate-insulating layer between the adjacent floating and erase gates 704 and 706. The reference numeral 710 designates an insulating layer electrically separating the control and erase gates 705 and 706 from each other. The reference numeral 711 designates gates of transistors within the peripheral circuit region. The reference numeral 712 designates an interlayer insulating layer. The reference numeral 713 designates main bit lines for memory cells. The reference numeral 714 designates contacts.

Manufacturing the flash EEPROM devices as illustrated in FIGS. 7 and 8 requires a number of oxidation processes after forming the gates. For example, after forming the floating gates, thermal oxidation processes are required to deposit the second gate-insulating layer 708 and the third gate-insulating layer 709. An oxide layer is deposited over the surface of the silicon substrate by thermal oxidation to protect the substrate surface from contamination prior to various ion implantation operations into source and drain regions of the peripheral transistors. In the oxidation processes, oxygen radical created within a furnace easily diverges through the separating regions in the form of silicon dioxide and reaches the floating gate of each memory cell, the transfer gate of each memory cell and the gate of each peripheral transistor, thereby oxidizing the silicon substrate and the material of the gates. This encroachment of the oxide into the bottom of the floating gate of each memory cell, the transfer gate of each memory cell and the gate of each transistor is known as a "gate bird's beak" because of its shape when viewed in cross-section.

This bird's beak causes the amount of ON-current of each memory cell or each peripheral transistor to drop appreciably. This is because the CVD deposited oxide layer that forms the separating insulating layer has poor oxidation proof, thereby allowing oxygen radical to reach the interface between the gate, gate-insulating layer and silicon substrate. This results in increased thickness of the gate-insulating layer.

Another problem posed by the bird's beak is to provide a limitation to scaling down of each memory cell. This is because the bird's beak narrows the effective channel width as compared to the designed one. Since the amount or size of the bird's beak is inherently determined by the process of manufacturing the devices, its influence upon width of the effective channel gradually increases as the size of each memory cell decreases.

An object of the present invention to provide a semiconductor device which has eliminated or reduced the bird's beak, thereby making it possible to scaling down of the size of each memory cell and each peripheral transistor, and a process of making it.

SUMMARY OF THE INVENTION

According to one aspect of the present invention, there is provided a semiconductor device including adjacent elements separated by an electrically insulating layer, wherein said insulating layer has a portion that has an oxidation proof property.

According to another aspect of the present invention, there is provided a process of making a semiconductor device, comprising the steps of:

forming a sandwich structure on a semiconductor substrate by laminating a first oxide layer, a nitride layer and a second oxide layer;

depositing, by optical lithography, a photo resist extending over each neighboring elements separating region; and removing, by dry etching using said photo resist as a mask, portions of said sandwich structure that extend over active regions.

According to still another aspect of the present invention, there is provided a process of making a semiconductor device comprising the steps of:

forming an oxide layer on a semiconductor substrate;

depositing, by optical lithography, a photo resist extending over each neighboring elements separating region;

removing, by dry etching using said photo resist as a mask, portions of said oxide layer that extend over active regions to define openings; and depositing, by CVD, a nitride layer over said etched oxide layer and the exposed semiconductor substrate; and removing, by anisotropically etching, said nitride layer leaving portions extending along the sidewall of the openings, in said etched oxide layer.

DESCRIPTION OF THE PREFERRED EMBODIMENTS

First Embodiment

Figure 1A:
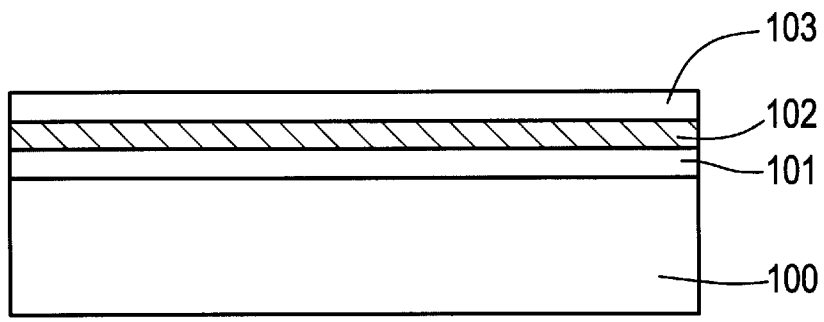
FIGS. 1A through 1C illustrate a portion of sequential process steps in manufacturing a first embodiment of a flash EEPROM array according to the present invention.
Figure 1B:
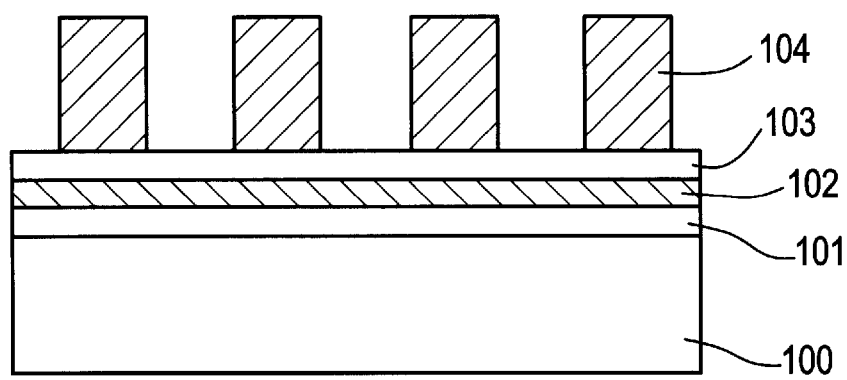
Figure 1C:
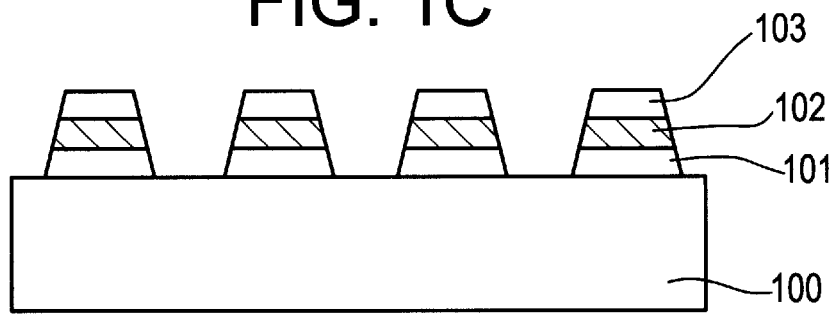

Referring to FIGS. 1A, 1B, and 1C, a method of fabricating a first preferred embodiment of a semiconductor memory device according to the present invention is described.

As shown in FIG. 1A, on top of a silicon substrate 100, thermal oxidation or CVD grows an oxide layer 101 of silicon dioxide. Subsequently, a nitride layer 102 of silicon nitride and an oxide layer 103 of silicon dioxide are deposited in this order on the oxide layer 101 by CVD to form an oxide/nitride/oxide sandwich structure, which serves as an electrically insulating layer.

As shown in FIG. 1B, optical lithography transfers patterns on a mask to a thin layer of photoresist on the oxide layer 103. These patterns define the regions separating the adjoining elements. Thus, the resist patterns 104 extend to cover such separating regions, respectively.

Using the resist patterns 104 as a mask, the oxide layer 103, nitride layer 102 and oxide layer 101 are removed by plasma-assisted etching process using a mixed gas of carbon tetrafluoride ($CF_4$) gas and carbon hydride trifluoride ($CHF_3$) gas. FIG. 1C shows the essentially vertically edged but slightly tapered profile of each of the etched regions of the oxide 103/nitride 102/oxide 101 sandwich structure as the result of the plasma etching after removing the resist mask.

Figure 2A:
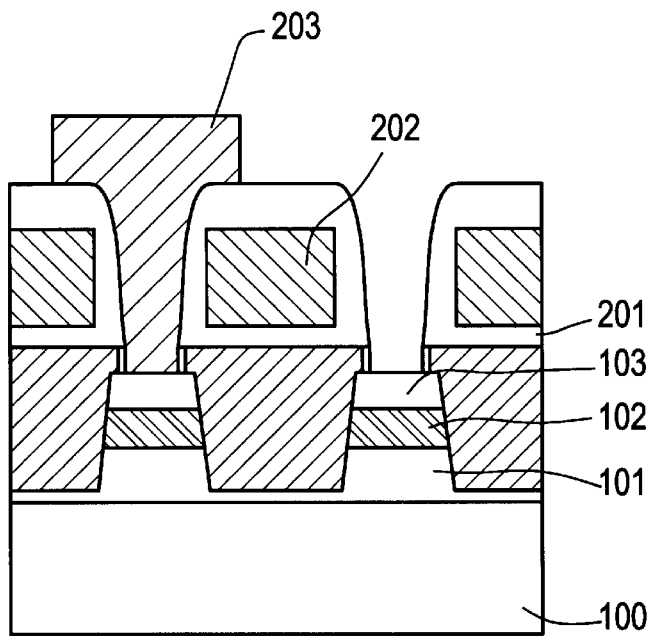
FIG. 2A is a sectional view of the flash EEPROM array according to the first embodiment.
Figure 2B:
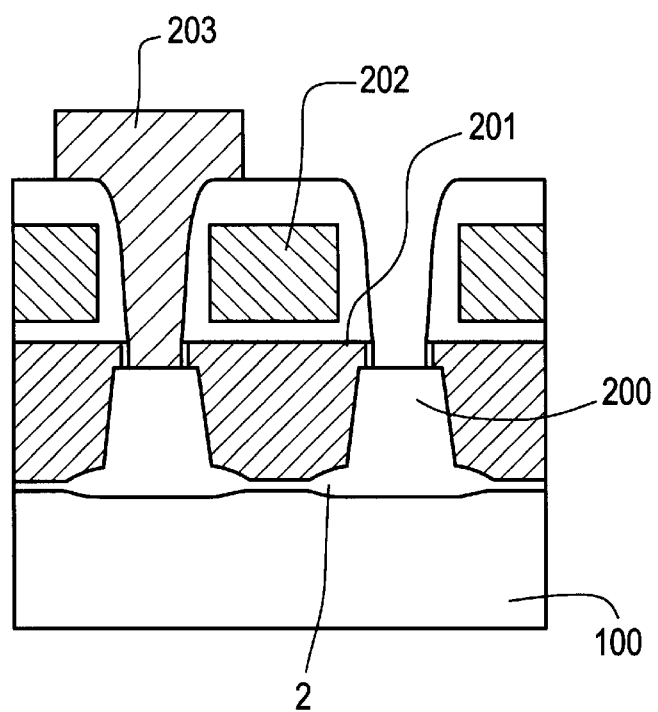
FIG. 2B is a sectional view similar to FIG. 2A of a flash EEPROM array according to the prior art.

FIGS. 2A and 2B are schematic views of SEM micrographs. The schematic view of FIG. 2A illustrates the result of fabrication of the flash EEPROM of the kind illustrated in FIGS. 8 and 9 using the oxide/nitride/oxide sandwich structure as the separating region. The schematic view of FIG. 2B illustrates the result of fabrication of the flash EEPORM (see FIGS. 8 and 9) using a single oxide layer as separating region. Comparing FIG. 2A with FIG. 2B reveals that occurrence of a bird's beak 2 (see FIG. 2B) is considerably suppressed by the use of oxide/nitride/oxide sandwich structure. This is because the nitride layer 102 has an oxidation proof property that is effective in preventing oxygen radical from reaching a floating gate 201 and a transfer gate, not shown, in each memory cell. In FIGS. 2A and 2B, the reference numeral 202 indicates a control gate, and the reference numeral 203 an erase gate.

Second Embodiment

Referring to FIGS. 3A, 3B, 3C, 3D, and 3E, a method of fabricating a second preferred embodiment of a semiconductor memory device according to the present invention is described.

Figure 3A:
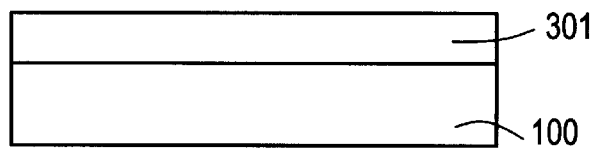
FIGS. 3A through 3E illustrate a portion of sequential process steps in manufacturing a second embodiment of a flash EEPROM array according to the present invention.

As shown in FIG. 3A, on top of a silicon substrate 100, an oxide layer 301 of silicon dioxide is deposited by CVD.

Figure 3B:
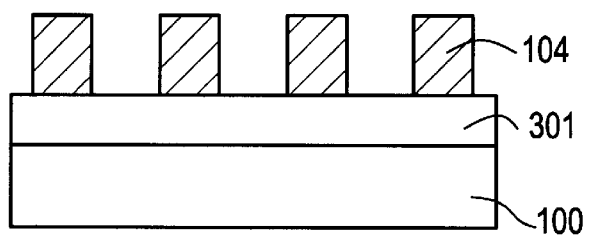

As shown in FIG. 3B, optical lithography transfers patterns on a mask to a thin layer of photoresist on the oxide layer 301. These patterns define the regions separating the adjoining elements in memory cells. Thus, the resist patterns 104 extend to cover such separating regions, respectively.

Using the resist patterns 104 as a mask, the oxide layer 301 is removed by plasma-assisted etching process using a mixed gas of carbon tetrafluoride ($CF_4$) gas and carbon dihydride difluoride ($CH_2F_2$) gas.

Figure 3C:
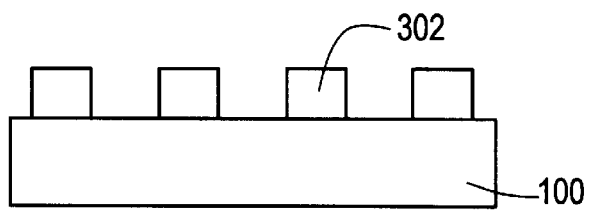

FIG. 3C shows the essentially vertically edged profile of each of the etched oxide regions 302 of silicon dioxide as the result of the plasma etching after removing the resist mask.

Figure 3D:
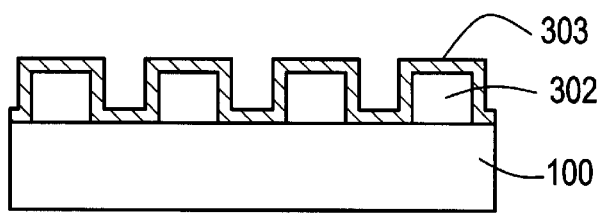

As shown in FIG. 3D, a nitride layer 303 of silicon nitride is deposited over the etched oxide regions 302 by CVD. This layer 303 is made thinner than half the minimum distance of distances among the adjacent elements on the substrate 100.

Figure 3E:
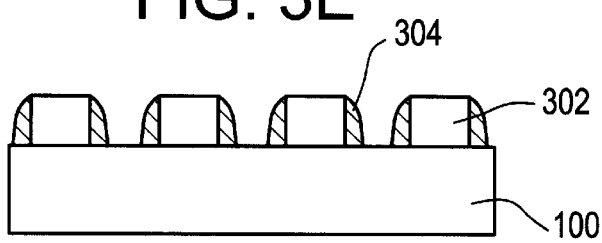

A next step is to anisotropically etch the nitride layer 303 away to leave only portions of the nitride layer 303 adjacent such side walls, such as in the form of spacers 304 along sidewalls of openings between the etched oxide regions 302, as illustrated in FIG. 3E.

The spacers 304 along the sidewalls of the openings between the etched oxide regions 302 are made of nitride silicon that possess oxidation proof property. Oxygen radical diverges within the etched oxide regions 302 of silicon dioxide in the thermal oxidation atmosphere. The oxidation proof nitride silicon spacers 304 prevent such oxygen radical from reaching the neighboring active regions, thereby eliminating the bird's beak encroachment in the fabrication processes.

Figure 4:
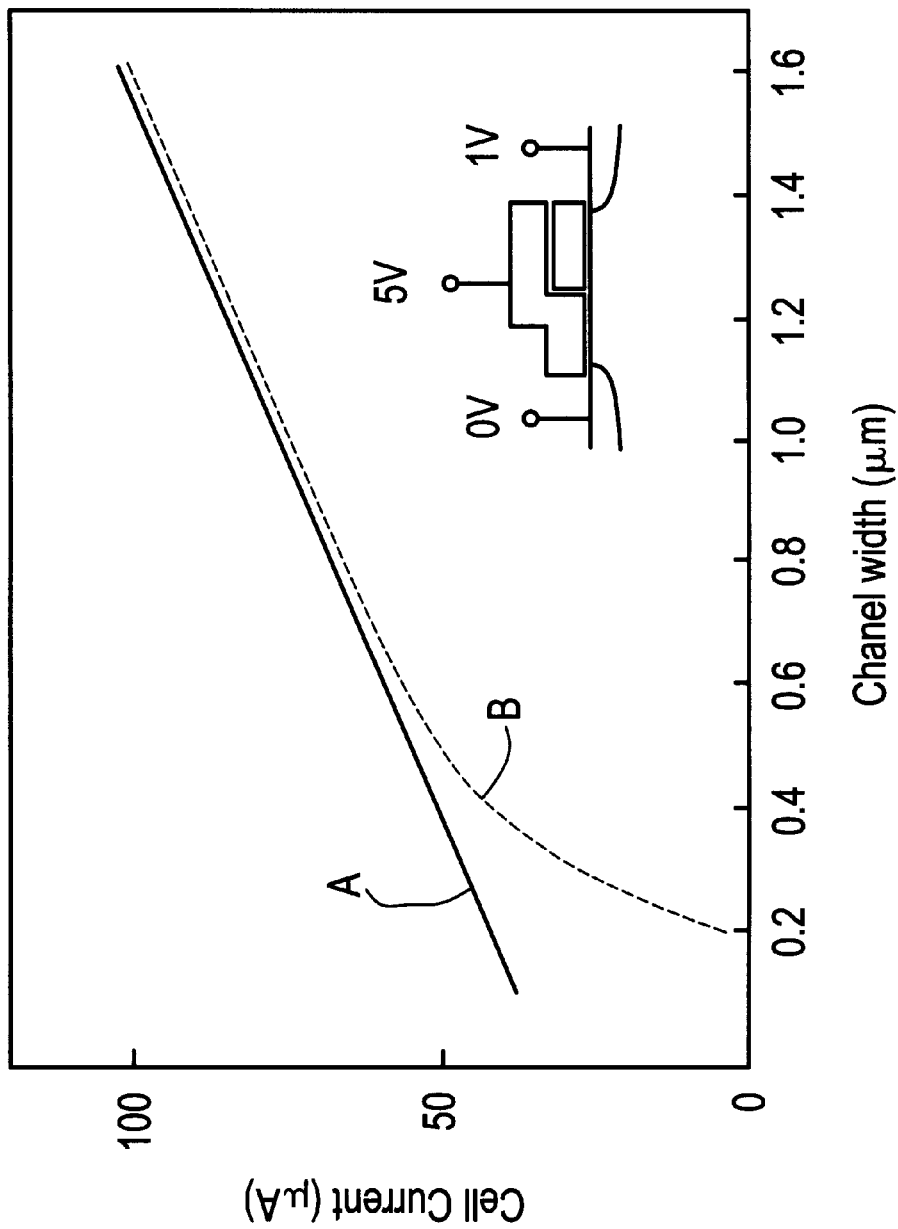
FIG. 4 illustrate a cell current vs., channel width characteristic curve A of the EEPROM according to the second embodiment in comparison with a cell current vs., channel width characteristic curve B of the conventional EEPORM shown in FIG. 2B.
Figure 5A:
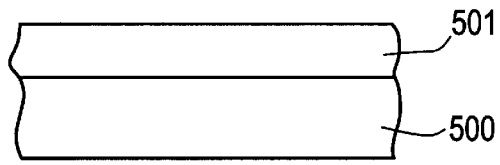
FIGS. 5A through 5E illustrate a portion of sequential process steps in manufacturing a flash EEPROM according to the prior art.
Figure 5B:
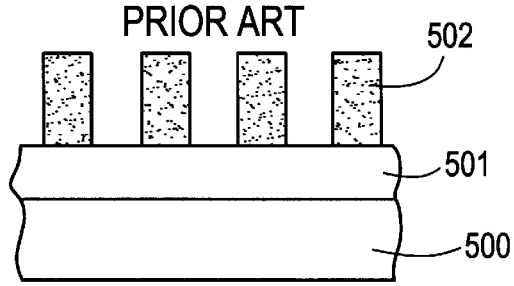
Figure 5C:
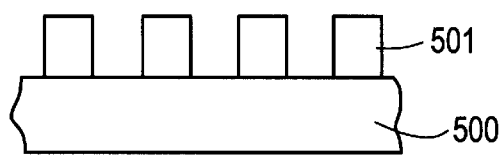
Figure 5D:
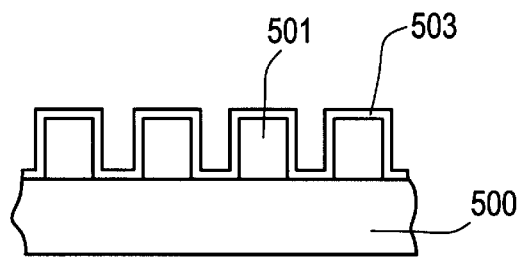
Figure 5E:
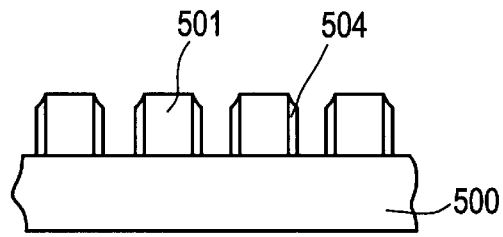
Figure 6A:
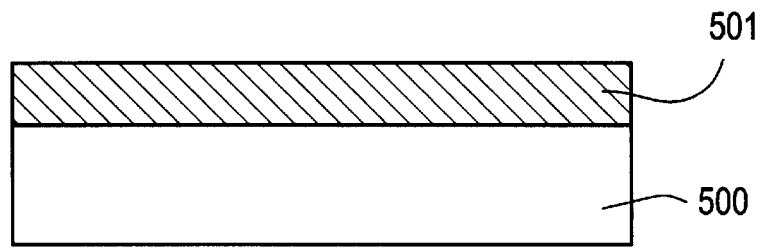
FIGS. 6A through 6C illustrate a portion of sequential process steps in manufacturing a flash EEPORM according to the prior art.
Figure 6B:
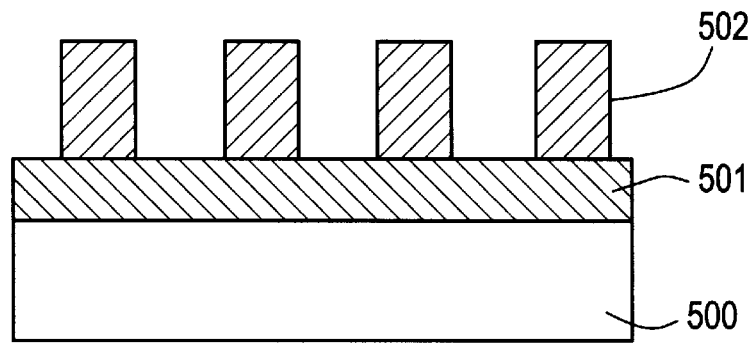
Figure 6C:
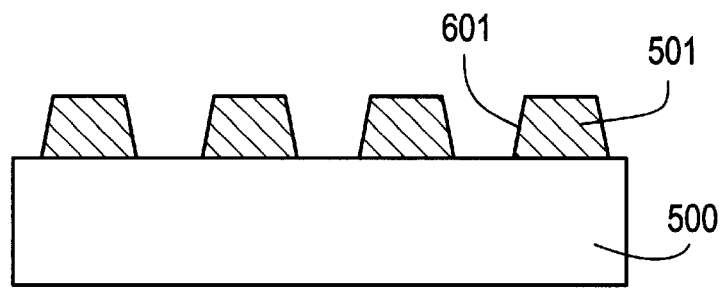
Figure 7:
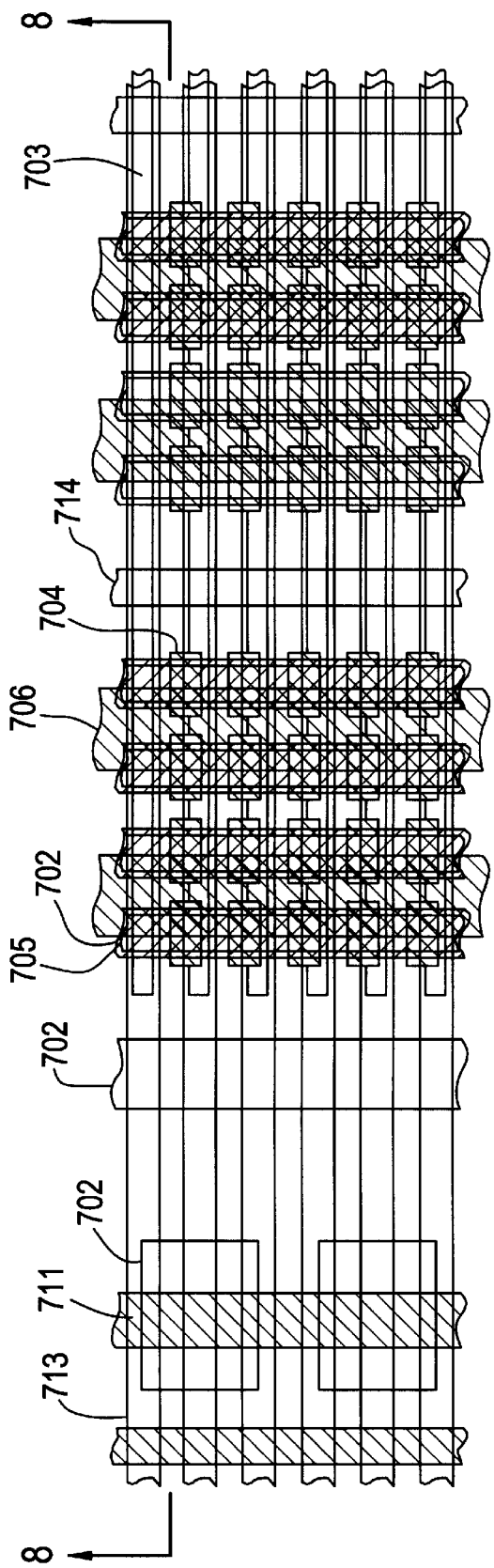
FIG. 7 is a plan view of a flash EEPROM according to the prior art.
Figure 8:
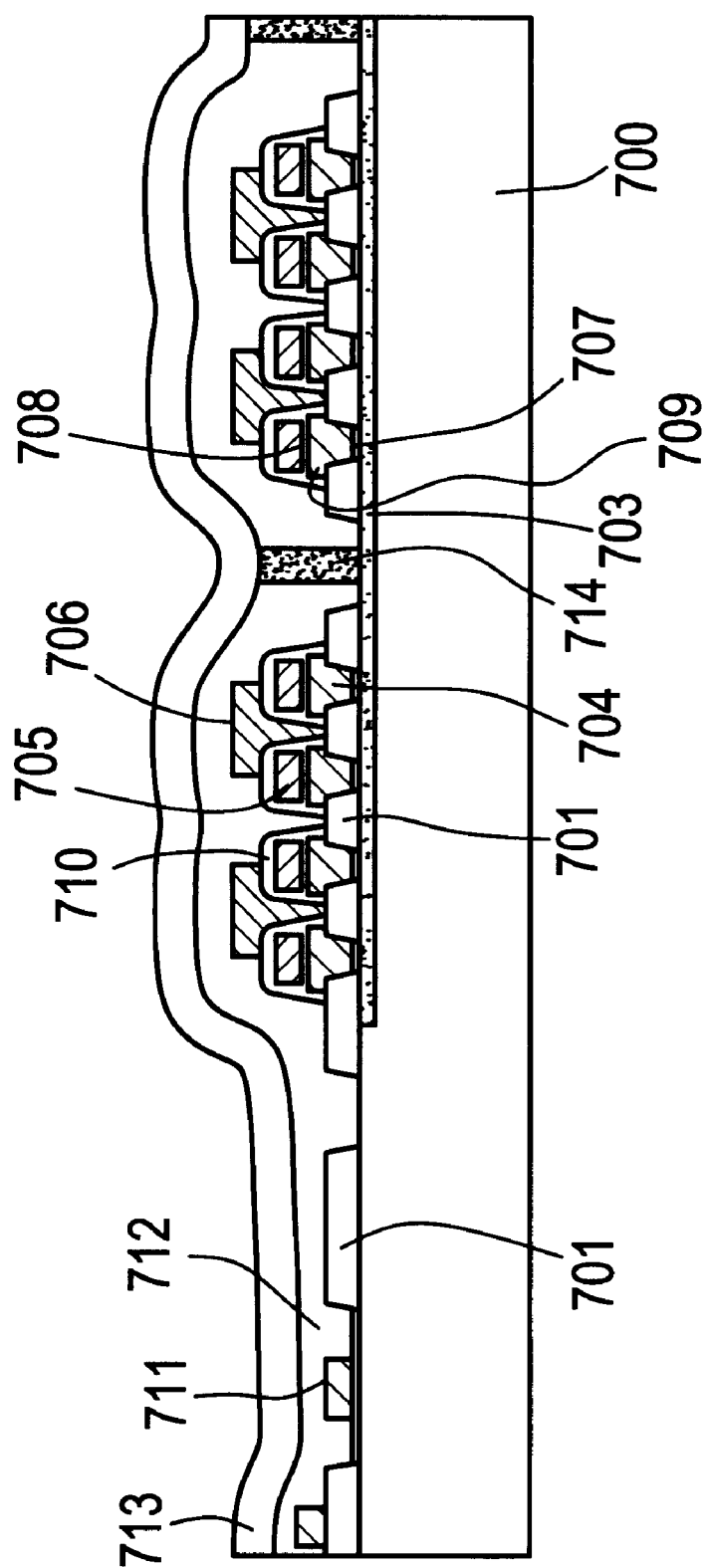
FIG. 8 is a sectional view taken through the line 8—8 in FIG. 7.

A flash EEPRORM, namely, EEPROM (A), of the kind illustrated in FIGS. 7 and 8 has been fabricated using the silicon nitride spacers 304 along the sidewalls of the openings of the etched silicon oxide layer according to the second embodiment. A flash EEPROM, namely, EEPROM (B), of the kind illustrated in FIGS. 7 and 8 has been fabricated using the etched silicon oxide layer according to the prior art. For comparison between the EEPROM (A) and (B), test has been conducted to measure the amount of ON-current through the EEPROMs (A) and (B) against various channel widths. Referring to FIG. 4, the fully drawn curve A and the dotted line curve B show measures resulting from the test conducted on the EEPROMs (A) and (B), respectively. The curve B shows that the bird's beak contributes to drop in the ON current at an increasing rate as the channel width becomes narrow. In other words, the linearity of the ON current against the channel width breaks, as the channel width becomes narrower than 0.8 $\mu$m. The curve A shows that the linearity holds due to elimination of the bird's beak.

The first and second embodiments employ the mixed gas of $CF_4$ gas and $CHF_3$ gas, and the mixed gas of $CF_4$ gas and $CH_2F_2$ gas, respectively, in the plasma-assisted dry etching. One may find etching conditions fit for giving the essentially vertically edged or slightly tapered profile of the etched regions in every gas, which, in plasma, can etch silicon oxide layer and silicon nitride layer. Most popular gases are mixed gases, each resulting from mixing at least two gases selected from a group consisting of $CF_4$ gas, $CHF_3$ gas, $CH_2F_2$ gas, $C_4F_8$ gas, CO gas, $SF_6$ gas, and Ar gas. In each combination of such gases, appropriately selecting process parameters, such as operating pressure, flow rate, ratio between gases, and operating voltage applied to the gas, can give a high degree of anisotropy enough for providing the essentially vertically edged or slightly tapered profile of the etched regions.

From the preceding description, it is appreciated that sufficiently high ON current is ensured in each cell and its peripheral transistors. This is because the existence of the oxidation proof nitride silicon a portion of the separating regions is operative to prevent oxygen radical that diverges within the separating regions from reaching the gate electrode silicon substrate interface, thereby eliminating the gate bird's beak.

The fact that the gate bird's beak has been eliminated allows scaling down of the cell array structure. This is because the linearity of ON current against channel width holds in memory cells and their peripheral transistors even when the channel width is very narrow.

What is claimed is:

1. A semiconductor device, comprising:

a semiconductor substrate;

a first silicon oxide portion formed on and in contact with said semiconductor substrate;

a second silicon oxide portion formed on and in contact with said semiconductor substrate, said first and second silicon oxide portions defining therebetween a region;

a floating gate electrode formed within said region; and side walls formed of silicon nitride that cover sides of each of said first and second silicon oxide portions except a top surface of each of said first and second silicon oxide portions, whereby said side walls serve as barriers against oxygen radicals diffused within each of said first and second silicon oxide portions.

2. A semiconductor device, comprising:

a semiconductor substrate including a plurality of active regions;

a first oxide layer disposed on and in contact with said semiconductor substrate, in which portions have been removed to define openings;

an electrically insulating section;

a plurality of adjacent floating gate electrodes, disposed in said openings on said first oxide layer on the active regions of said semiconductor substrate, and within said electrically insulating section; and said electrically insulating section, which separates and electrically insulates each floating gate electrode from the others, having a portion with an oxidation proof property for preventing oxidation of said active regions and said floating gate electrodes near said first oxide layer, said portion with the oxidation proof property being in contact with at least a portion of each said adjacent floating gate electrode, said electrically insulating section including a portion of said first oxide layer and spacers of a nitride layer extending along sidewalls of the openings within said first oxide layer, wherein said portion with the oxidation proof property is comprised of the nitride spacers.

* * * * *